U S007671446B2

(12) United States Patent  
Park

(10) Patent No.: US 7,671,446 B2  
(45) Date of Patent: Mar. 2, 2010

(54) SEMICONDUCTOR CAPACITOR AND MANUFACTURING METHOD

(75) Inventor: Hyung-Jin Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/964,509

(22) Filed: Dec. 26, 2007

(65) Prior Publication Data

US 2008/0157276 A1 Jul. 3, 2008

(30) Foreign Application Priority Data

Dec. 29, 2006 (KR) .................... 10-2006-0137335

(51) Int. Cl.
H01L 27/108 (2006.01)
(52) U.S. Cl. .............. 257/532; 257/303; 257/306; 257/E27.092
(58) Field of Classification Search ............. 257/758, 257/532, E27.092, 303, 306
See application file for complete search history.

(56) References Cited

U.S. PATENT DOCUMENTS

| 6,232,197 B1* | 5/2001 | Tsai ........................ 438/393 |
| 7,332,764 B2* | 2/2008 | Choi et al. ................ 257/300 |
| 2007/0042542 A1* | 2/2007 | Barth et al. .............. 438/243 |
| 2007/0152258 A1* | 7/2007 | Kim ......................... 257/309 |

* cited by examiner

*Primary Examiner*—N Drew Richards  
*Assistant Examiner*—Yu-Hsi Sun  
(74) *Attorney, Agent, or Firm*—Sherr & Vaughn, PLLC

(57) ABSTRACT

A capacitor can prevent a problem of step coverage in semiconductor device, caused by a thickness of an insulator film and an upper metal film included a metal-insulator-metal (MIM) capacitor, between the MIM capacitor region and its circumferential region. A capacitor in a semiconductor device includes a first metal film provided with a recess having a predetermined depth over a semiconductor substrate. An insulator film and a second metal film may be formed in the recess with a thickness corresponding to a depth of the recess. The insulator and second metal films are disconnected from an inner lateral side of the recess. A dielectric film including a plurality of plugs is in contact with the first and second metal films and the insulator film. A plurality of metal electrodes is in contact with the plugs over the dielectric film.

15 Claims, 10 Drawing Sheets

SEMICONDUCTOR CAPACITOR AND MANUFACTURING METHOD

Figure 1A:
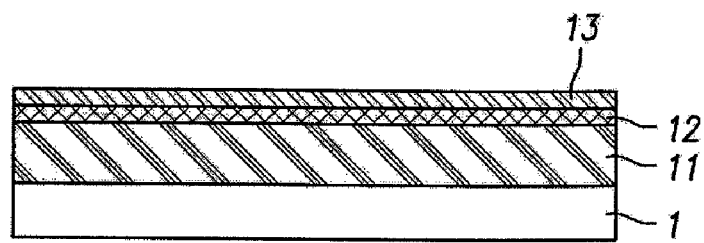
Figure 1B:
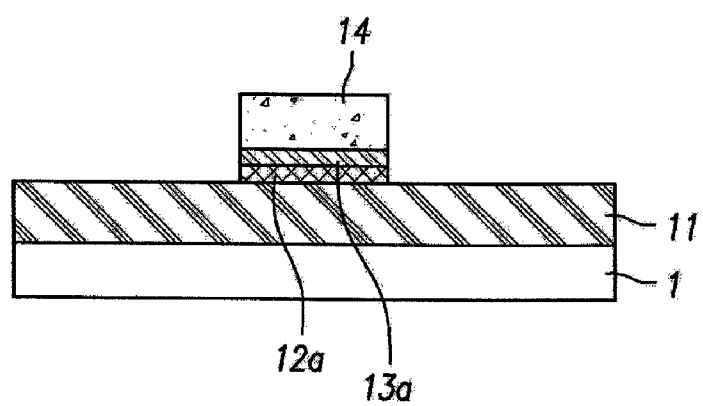

The present application claims priority under 35 U.S.C. 119 to Korean Patent Application No. 10-2006-0137335, filed on Dec. 29, 2006, which is hereby incorporated by reference in its entirety.

BACKGROUND

Example FIGS. 1A to 1D are cross sectional views explaining a related method of manufacturing a MIM (metal-insulator-metal) capacitor of a semiconductor device. As shown in example FIG. 1A, a lower metal film (lower capacitor electrode) 11, an insulator film 12 and an upper metal film (upper capacitor electrode) 13 are sequentially formed over a semiconductor substrate 1. Then, as shown in example FIG. 1B, a photoresist material is coated onto the upper metal film (upper capacitor electrode) 13, and the coated photoresist material is patterned so as to form a first photoresist pattern 14.

By performing an etching process using the first photoresist pattern 14 as a mask, the upper metal film 13 and the insulator film 12 are etched selectively. Through the selective etching process, an upper metal film pattern (upper capacitor electrode) 13a and an insulator film pattern 12a are formed, thereby completing an MIM (metal-insulator-metal) capacitor.

Figure 1C:
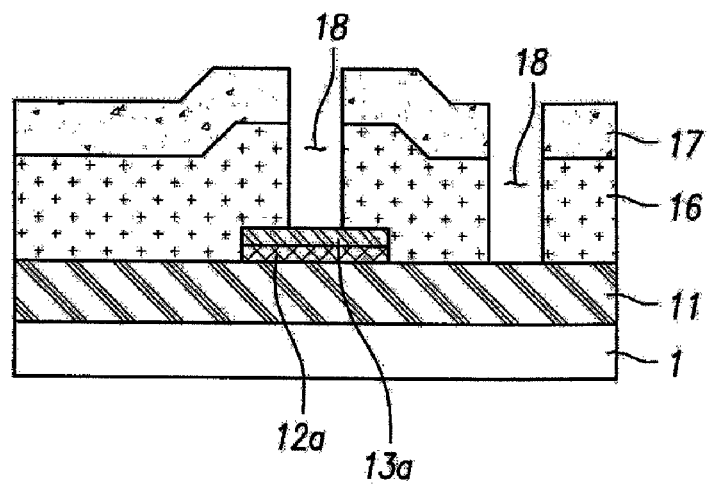

As shown in example FIG. 1C, etching and cleaning steps are performed to remove the first photoresist pattern 14. After that, a dielectric film 16 is formed over an entire surface of the semiconductor substrate 1 including the upper metal film pattern 13a. To form contact holes 18 in the dielectric film 16, a photoresist material is coated and patterned, thereby forming a second photoresist pattern 17. Through an etching process using the second photoresist pattern 17 as a mask, the dielectric film 16 is etched selectively, thereby forming the contact holes 18 to open predetermined portions of the lower metal film 11 and the upper metal film 13a.

Figure 1D:
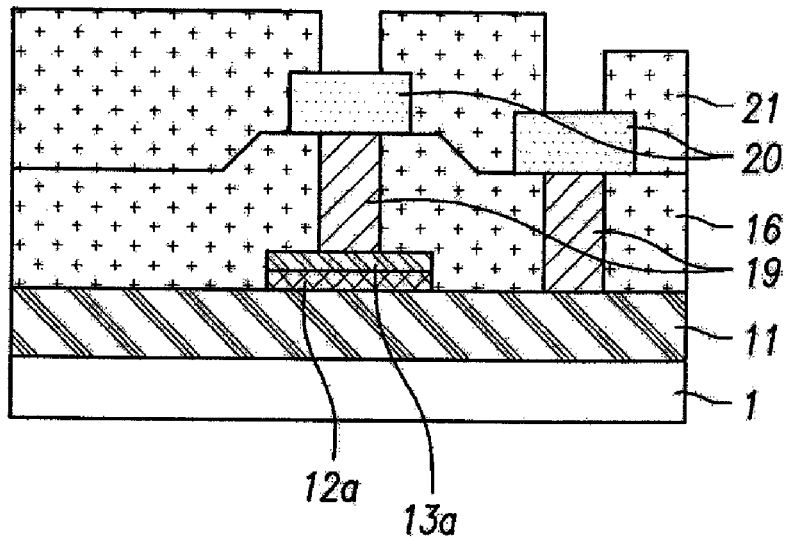

After removing the second photoresist pattern 17 by etching and cleaning, as shown in example FIG. 1D, a conductive film is deposited over the dielectric film pattern 16 so that the contact holes 18 are filled by the conductive film. Plugs 19, formed by the conductive film, are in contact with the lower metal film 11 and the upper metal film pattern 13a. After that, a metal film is deposited over the dielectric film pattern 16. The deposited metal film is patterned to thereby form metal electrodes 20 which contact the plugs 19. A nitride film is deposited over the metal electrodes 20 and selectively patterned, thereby forming a nitride film pattern 21 with openings for the metal electrodes 20.

The semiconductor device manufactured by the aforementioned method may have a problem of step coverage between an MIM capacitor region and its circumferential region. The problem may occur when depositing the dielectric film 16, due to the thickness of the insulator film 12a and the upper metal film (upper capacitor electrode) 13a included in the MIM capacitor. Due to the step coverage between the MIM capacitor region and its circumferential region, a DOF (Depth of Focus) margin becomes insufficient, creating a problem of an imprecise pattern. Also, an entirely uneven surface of a wafer causes a limitation in flatness achievable in a chemical mechanical polishing (CMP) process.

SUMMARY

Embodiments relate to a capacitor which can prevent a problem of step coverage in semiconductor device, caused by a thickness of an insulator film and an upper metal film included a metal-insulator-metal (MIM) capacitor, between the MIM capacitor region and its circumferential region.

Embodiments relate to a capacitor of semiconductor device including a first metal film provided with a recess having a predetermined depth over a semiconductor substrate. An insulator film and a second metal film may be formed in the recess with a thickness corresponding to a depth of the recess. The insulator and second metal films are disconnected from an inner lateral side of the recess. A dielectric film including a plurality of plugs is in contact with the first and second metal films and the insulator film. A plurality of metal electrodes is in contact with the plugs over the dielectric film.

Embodiments relate to a capacitor of semiconductor device which includes a first metal film provided with a recess having a predetermined depth over a semiconductor substrate. A plurality of capacitors may be formed by sequentially depositing an insulator film and a second metal film over the recess.

Embodiments relate to a capacitor in semiconductor device which includes a first metal film (lower electrode of first capacitor) provided with a recess having a predetermined depth over a semiconductor substrate. A first insulator film and a second metal film may be formed in the recess with a thickness corresponding to a depth of the recess. The first insulator film and second metal film are disconnected from an inner lateral side of the recess. A first dielectric film pattern may include a plurality of first plugs which are respectively in contact with the first and second metal films and the first insulator film. A first metal line is in contact with the first plug. A first step-coverage metal film (lower electrode of second capacitor), is in contact with the first plug which is brought into contact with the second metal film, provided at a predetermined interval from the first metal line. A second insulator film and a fourth metal film (upper electrode of second capacitor) are disconnected from the inner lateral side of the first step-coverage metal film over the lower portion of the first step-coverage metal film. A second dielectric film pattern including a plurality of second plugs which are respectively brought into contact with the first metal line, the fourth metal film and the first step-coverage metal film over the first metal line and the first step-coverage metal film. A second metal line is in contact with the second plug which is brought into contact with the first step-coverage metal film over the second dielectric film pattern. A second step-coverage metal film (lower electrode of third capacitor), being in contact with the second plugs which are respectively brought into contact with the first metal line and the fourth metal film, overlapped with the first metal line and the fourth metal film at a predetermined interval from the second metal line over the second dielectric film pattern. A third insulator film pattern and a sixth metal film are formed in sequence to be disconnected from the inner lateral side of the second step-coverage metal film over the second step-coverage metal film. A third dielectric film including a plurality of third plugs being in contact with the second metal line, the sixth metal film and the second step-coverage metal film over the second step-coverage metal film and the second metal line. A first upper metal electrode is in contact with the third plug which is brought into contact with the second metal line over the third dielectric film. A second upper metal electrode is in contact with the plurality of third plugs which are brought into contact with the second step-coverage metal film and the sixth metal film over the third dielectric film.

Embodiments relate to method of manufacturing a capacitor of semiconductor device which includes forming a first metal film provided with a recess having a predetermined depth over a semiconductor substrate. An insulator film and a second metal film are deposited over the recess with a predetermined thickness corresponding to a depth of the recess. A dielectric film pattern including plugs is formed in contact with the first metal film and the second metal film over the first metal film and the second metal film.

Embodiments relate to a method of manufacturing a capacitor of semiconductor device which includes forming a first metal film provided with a recess having a predetermined depth over a semiconductor substrate. A first insulator film and a second metal film are formed in the recess, wherein the first insulator film and the second metal film are disconnected from an inner lateral side of the recess. A first dielectric film pattern including a plurality of first plugs are formed in contact with the first metal film and the second metal film over the first metal film. A first metal line is formed in contact with the first plug which is in contact with the first metal film over the first dielectric film pattern. A first step-coverage metal film is formed in contact with the first plug which is brought into contact with the second metal film, provided at a predetermined interval from the first metal line. A second insulator film and a fourth metal film are formed to be disconnected from the inner lateral side of the first step-coverage metal film over the lower portion of the first step-coverage metal film. A second dielectric film pattern including a plurality of second plugs formed in contact with the first metal line, the fourth metal film and the first step-coverage metal film over the first metal line and the first step-coverage metal film. A second metal line in contact with the second plug which is in contact with the first step-coverage metal film over the second dielectric film pattern. A second step-coverage metal film formed in contact with the second plugs which are in contact with the first metal line and the fourth metal film, provided at a predetermined interval from the second metal line over the second dielectric film pattern. A third insulator film pattern and a sixth metal film (upper electrode of third capacitor) are formed in sequence and disconnected from the inner lateral side of the second step-coverage metal film over the upper portion of the second step-coverage metal film. A third dielectric film pattern including a plurality of third plugs formed in contact with the second metal line, the sixth metal film and the second step-coverage metal film over the second step-coverage metal film and the second metal line. A first upper metal electrode formed in contact with the third plug which is brought into contact with the second metal line over the third dielectric film. A second upper metal electrode is formed in contact with the plurality of third plugs which are in contact with the second step-coverage metal film and the sixth metal film over the third dielectric film.

DRAWINGS

FIGS. 1A to 1D are cross sectional views explaining a manufacturing method of a MIM capacitor in a semiconductor device according to the related art.

Example FIGS. 2A to 2F are cross sectional views explaining a manufacturing method of a MIM capacitor in a semiconductor device according to embodiments.

Example FIGS. 3A to 3J are cross sectional views explaining a manufacturing method of a stack MIM capacitor in a semiconductor device according to embodiments.

Figure 3A:
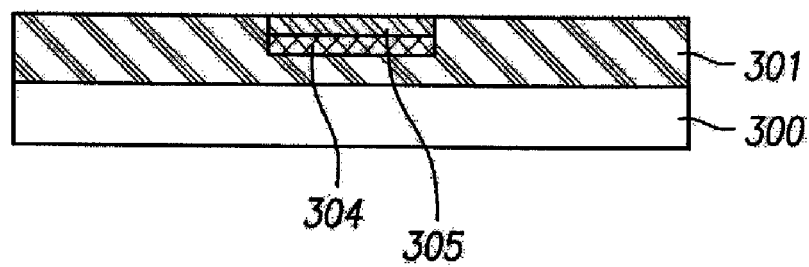
Figure 3B:
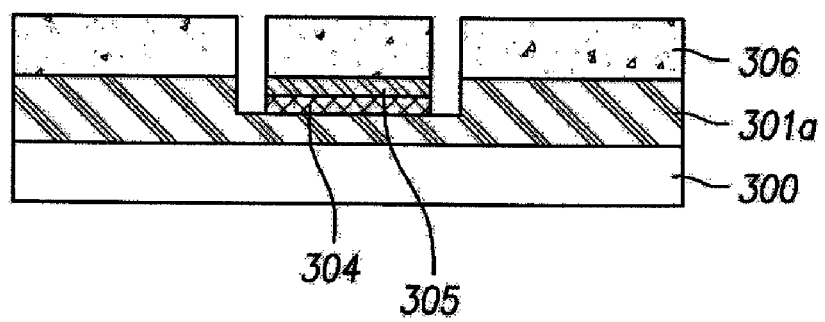
Figure 3C:
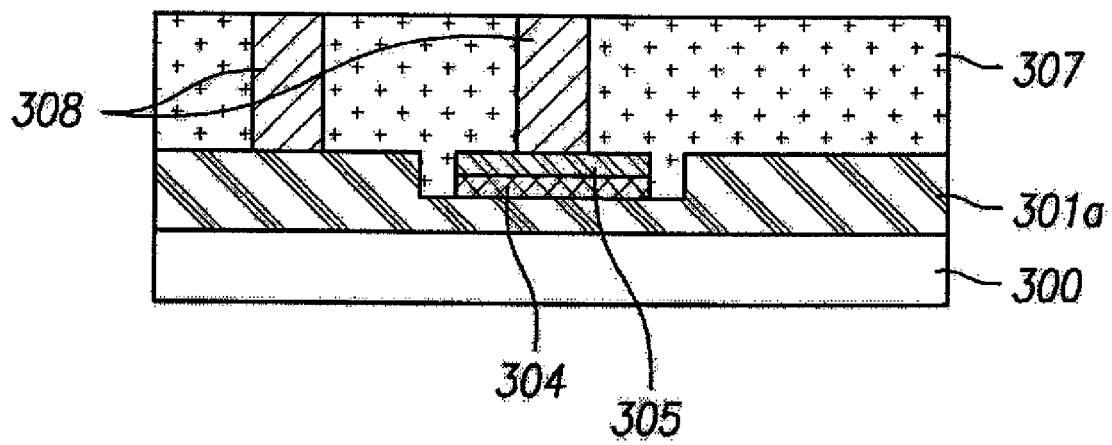
Figure 3D:
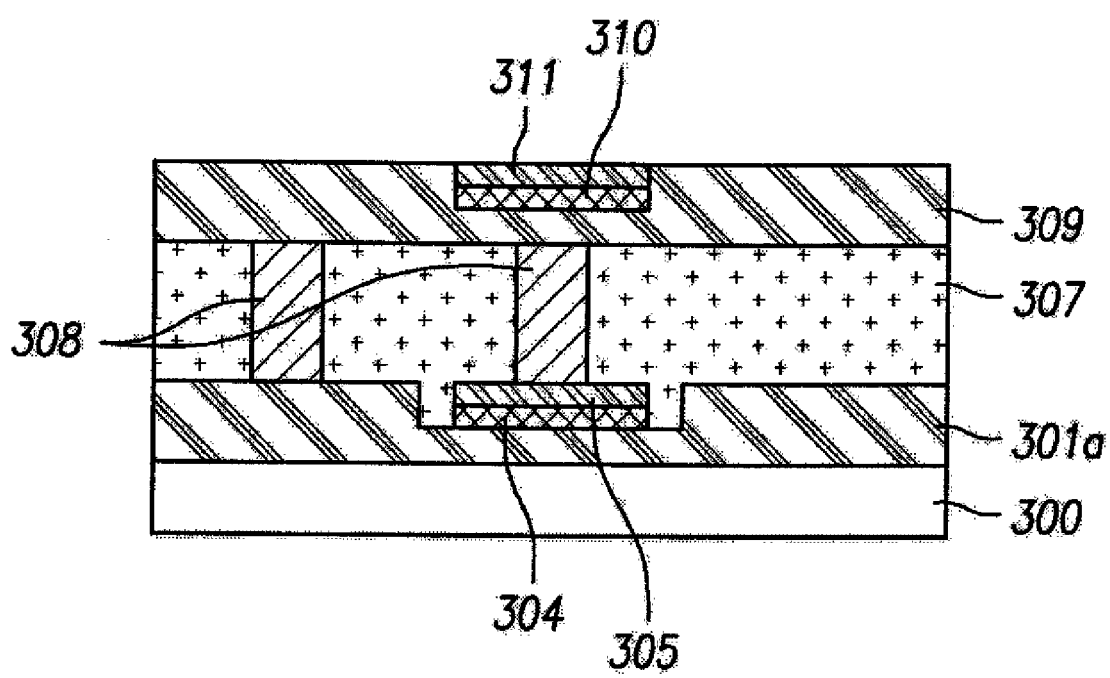
Figure 3E:
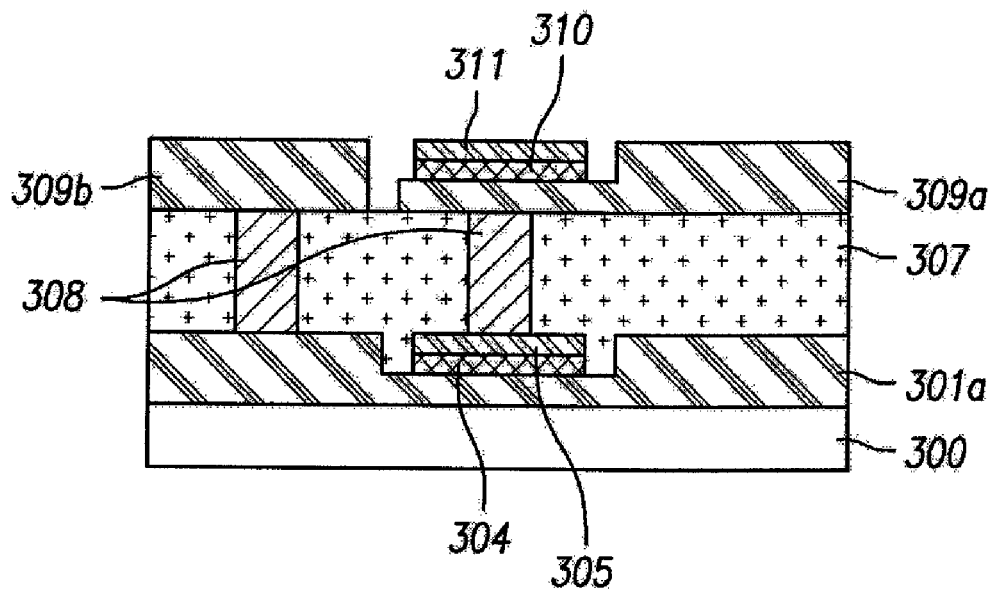
Figure 3F:
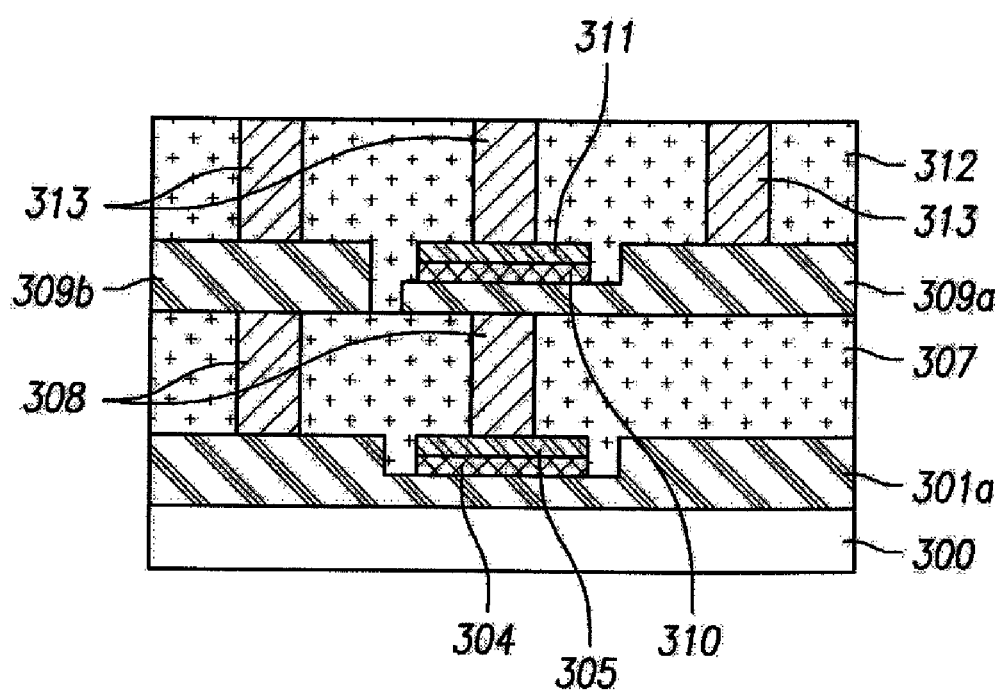
Figure 3G:
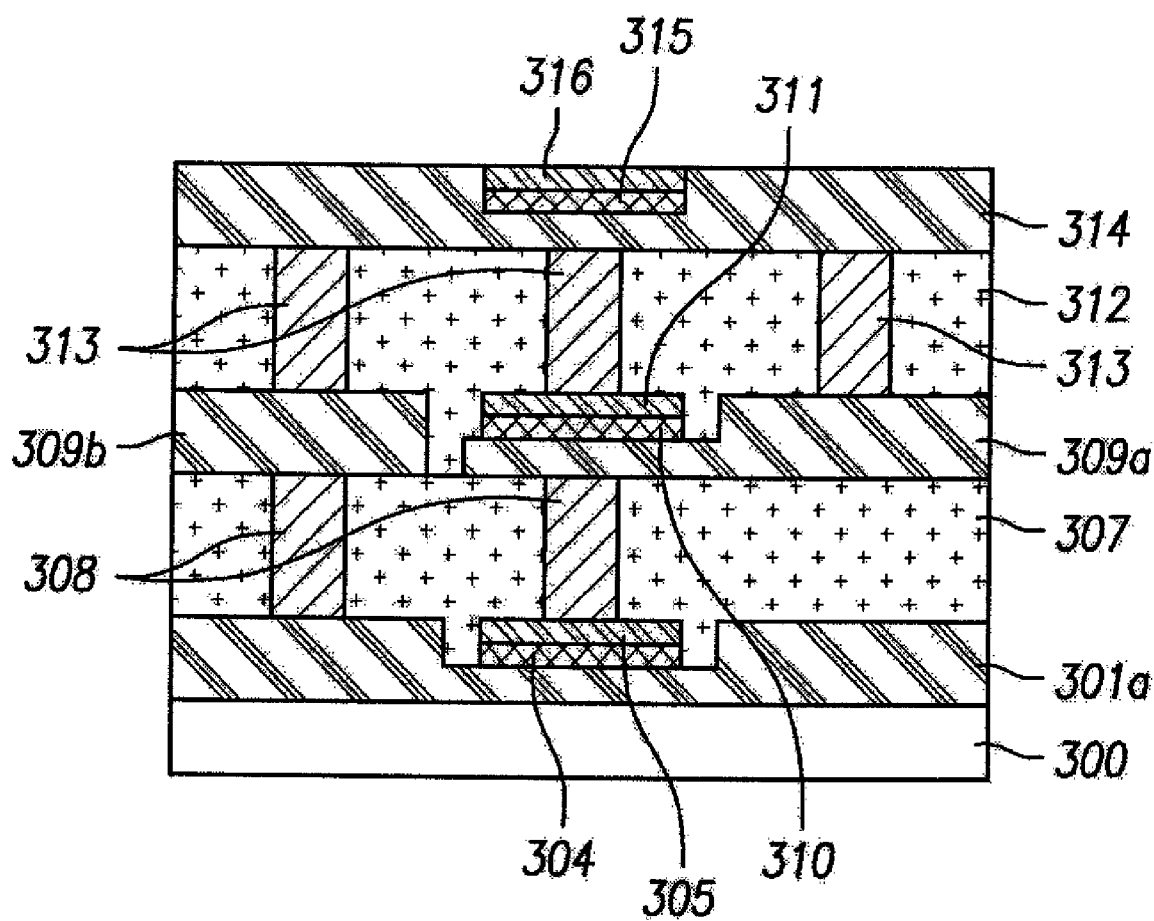
Figure 3H:
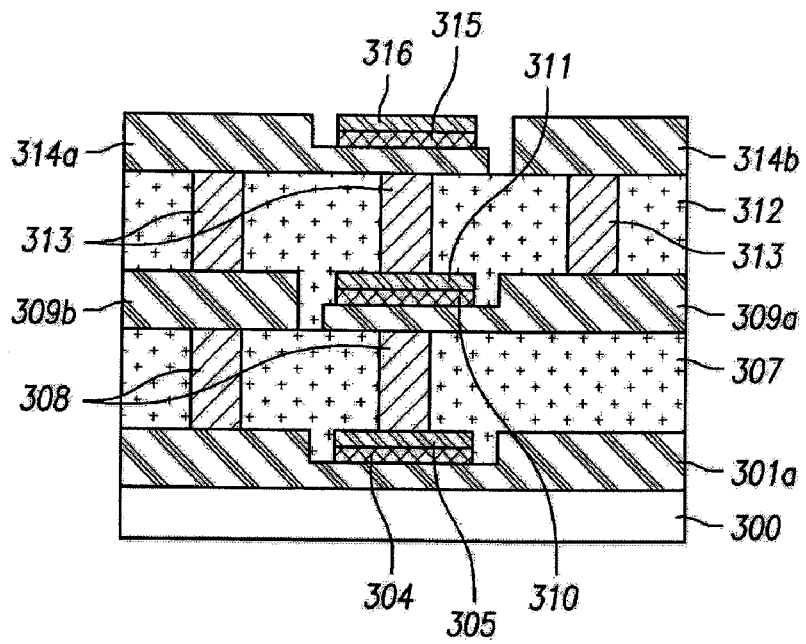
Figure 3I:
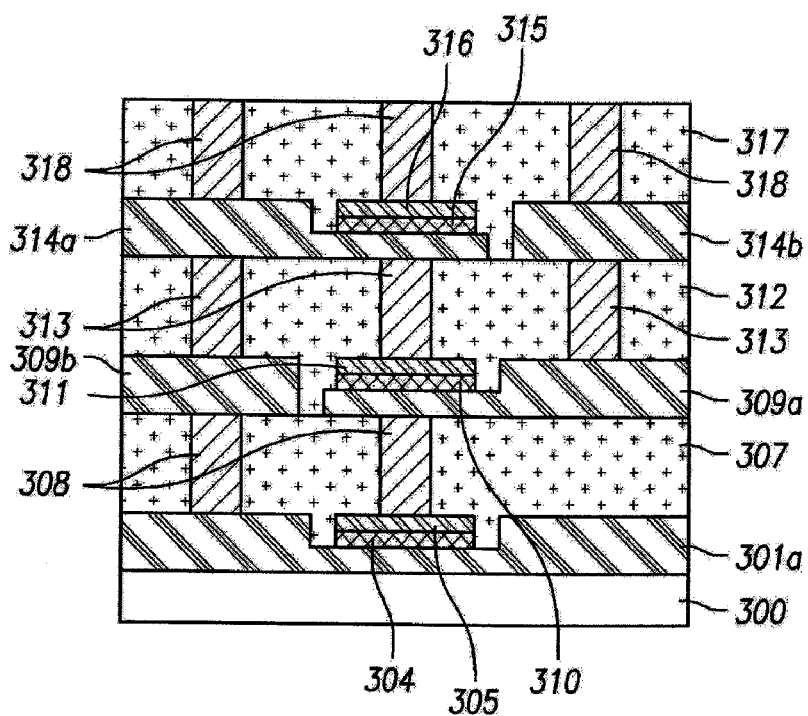
Figure 3J:
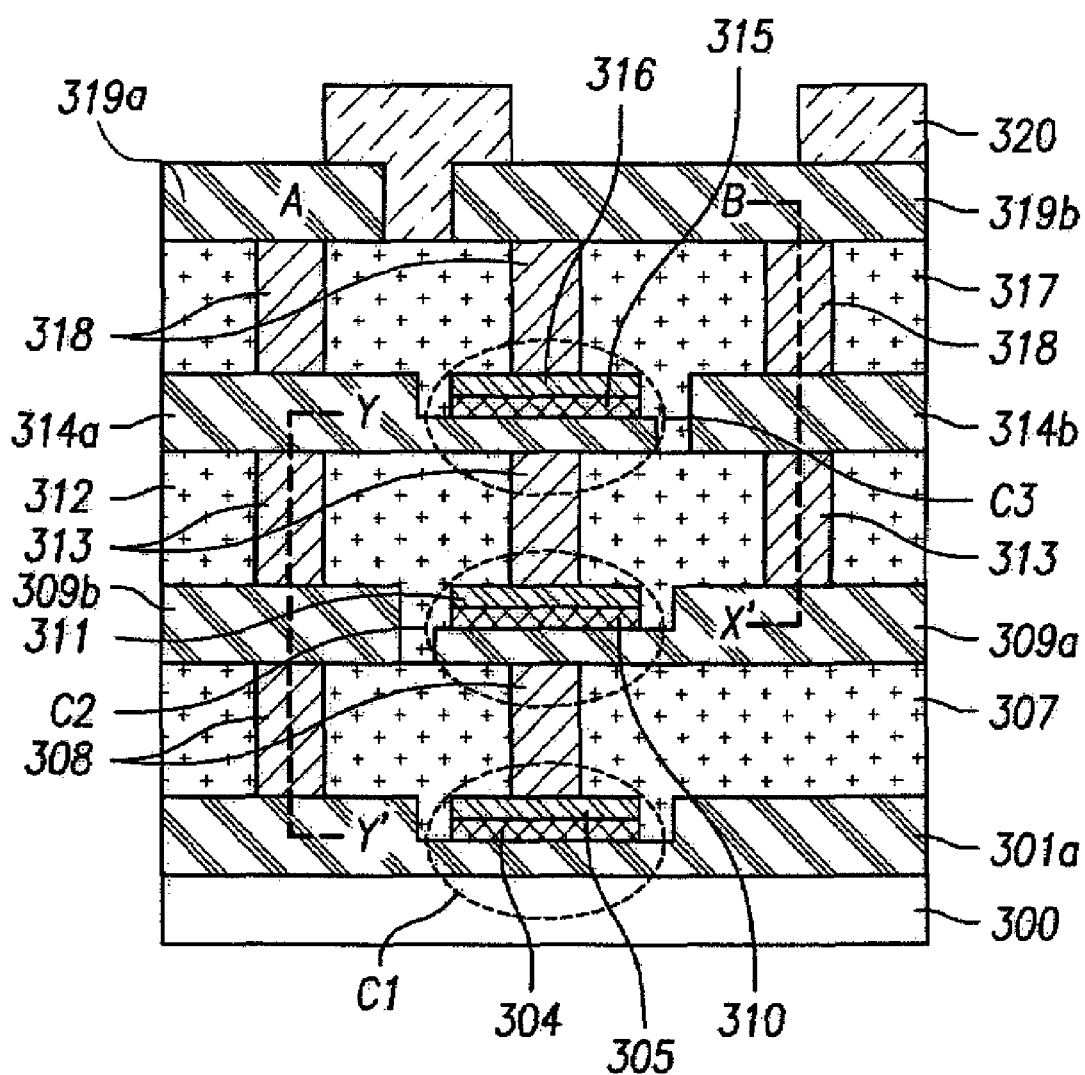
Figure 4:
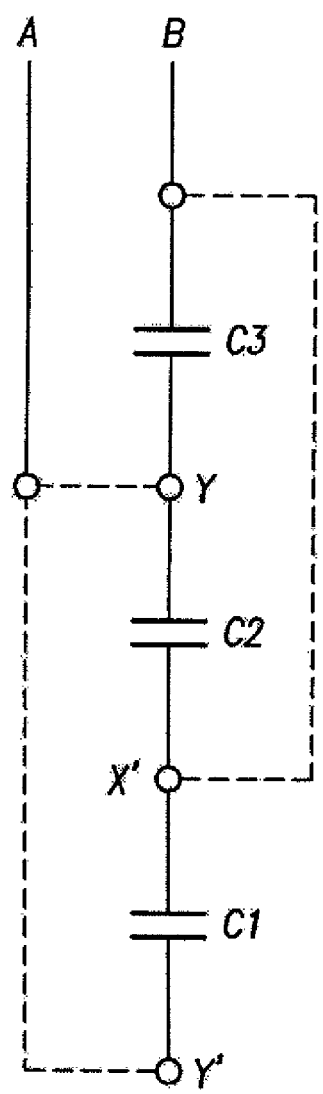

Example FIG. 4 is an equivalent circuit diagram of FIG. 3J.

DESCRIPTION

Example FIGS. 2A to 2F are cross sectional views explaining a manufacturing method of a MIM capacitor in a semiconductor device according to embodiments. As shown in example FIG. 2A, a first metal film having a predetermined thickness may be formed over a semiconductor substrate 200. Then, a photoresist layer may be coated over the first metal film, and the coated photoresist layer is patterned, thereby forming a first photoresist pattern. The first metal film may be formed of aluminum (Al) or copper (Cu) at a predetermined thickness between approximately 4000 Å and 5000 Å.

By performing an etching process using the first photoresist pattern as a mask, the first metal film 201 is provided with a recess having a predetermined depth. Then, the first photoresist pattern is removed by etching and cleaning. In this case, the recess included in the first metal film (lower capacitor electrode) 201 is formed to depth of about 1250 Å to 1440 Å.

An insulator film 204 provided with a thickness of about 700 Å to about 840 Å. A second metal film (upper capacitor electrode) 205 provided at a thickness of about 450 Å to 600 Å are sequentially deposited over an entire surface of the first metal film (lower capacitor electrode) 201, whereby the recess is filled-up.

Then, a planarization process using a CMP (chemical mechanical polishing) is carried out to expose the first metal film (lower capacitor electrode) 201. The total thickness of the insulator film 204 and second metal film (upper capacitor electrode) 205 deposited in sequence may correspond to the depth of the recess included in the first metal film 201. Also, the upper surface of the second metal film 205 may be the same height as the upper surface of the first metal film 201. The second metal film 205 may be formed of aluminum (Al) or copper (Cu).

Figure 2A:
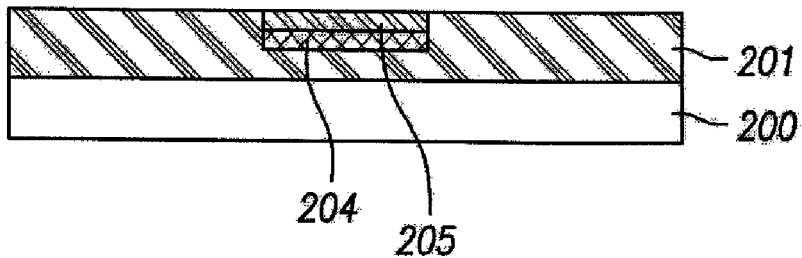
Figure 2B:
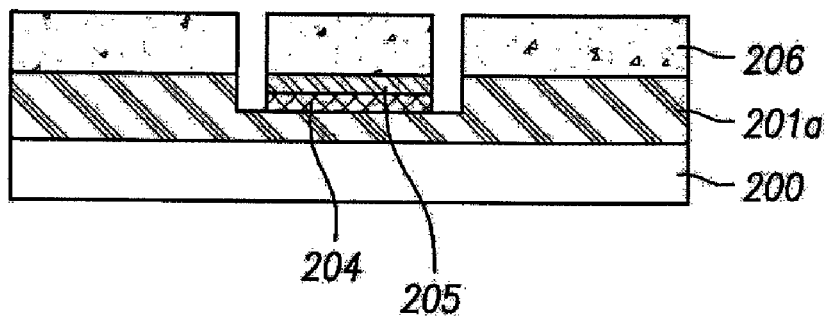

As shown in example FIG. 2B, a photoresist layer is coated over the first metal film (lower capacitor electrode) 201 including the insulator film 204 and the second metal film (upper capacitor electrode) 205, and then the coated photoresist layer is patterned, thereby forming a second photoresist pattern 206. The first metal film 201 is selectively etched to the initial recess depth using the second photoresist pattern 206 as a mask. This etching process disconnects the lateral sides of the insulator film 204 and second metal film 205 from the inner lateral side of the recess in the first metal film 201.

Figure 2C:
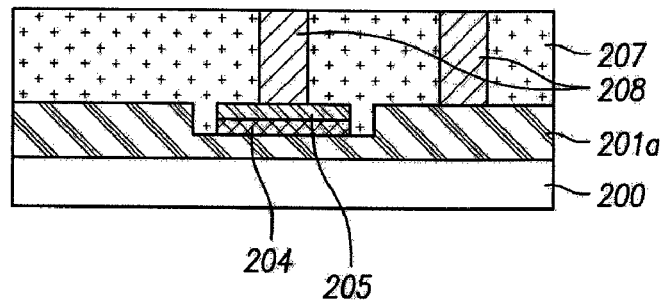

Referring to example FIG. 2C, the second photoresist pattern 206 is removed by etching and cleaning. A first dielectric film is formed over an entire surface of the first metal film 201a including the insulator film 204 and the second metal film 205. To form contact holes in the first dielectric film, a photoresist layer is coated and patterned, thereby forming a third photoresist pattern. An etching process using the third photoresist pattern as a mask is performed to selectively etch the first dielectric film, thereby forming a first dielectric film pattern 207 including the contact holes.

The third photoresist pattern is removed by etching and cleaning. A conductive film is deposited over the first dielectric film pattern 207 including the contact holes, so that the contact holes are filled up with conductive material. A planarization process using a CMP exposes the first dielectric film pattern 207, forming plugs 208 which contact the first and second metal films.

Figure 2D:
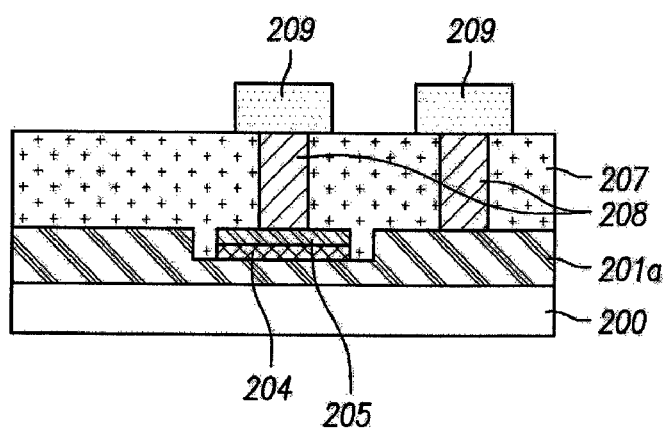

As shown in example FIG. 2D, a third metal film is deposited over the first dielectric film pattern 207 including the plugs 208. A photoresist layer is coated over the third metal film, and the coated photoresist layer is patterned to form a fourth photoresist pattern. The third metal film is etched selectively using the fourth photoresist pattern as a mask, thereby forming third metal film patterns (metal electrodes) 209 in contact with the plugs 208. Then, the fourth photoresist pattern is removed by etching and cleaning.

Figure 2E:
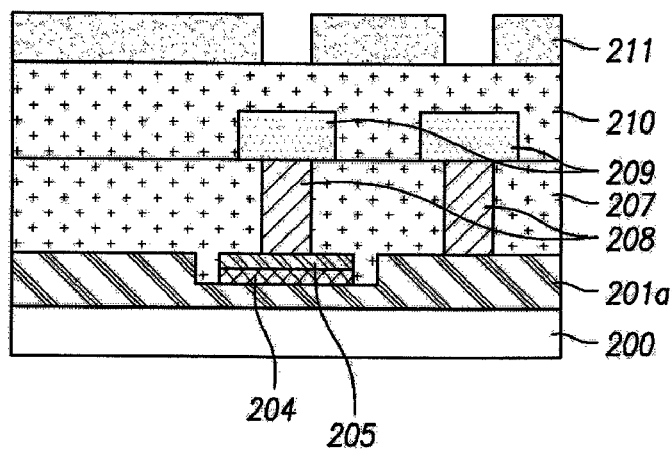

As shown in example FIG. 2E, a second dielectric film 210 is deposited over the entire surface of the semiconductor substrate 200 including the third metal film patterns 209. Then, a photoresist layer is coated over the second dielectric film 210, and the coated photoresist layer is patterned to form a fifth photoresist pattern 211. The second dielectric film 210 may be formed of a silicon nitride ($Si_3N_4$) film.

Figure 2F:
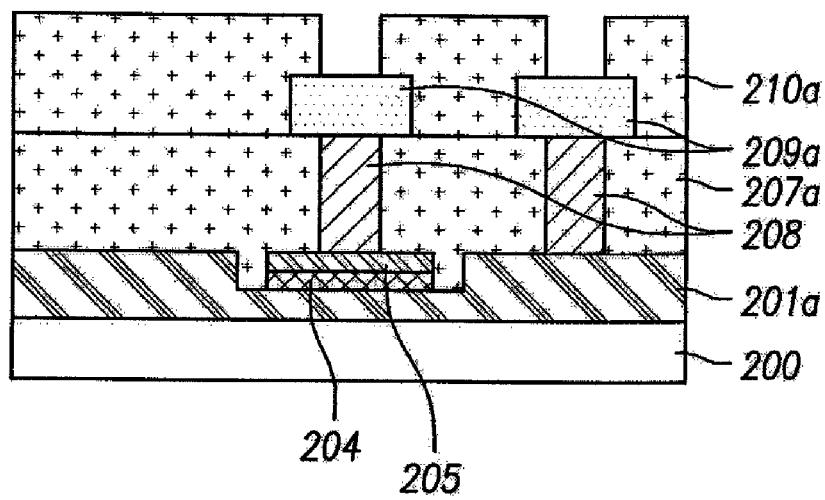

Referring to example FIG. 2F, an etching process using the fifth photoresist pattern 211 as a mask is applied to the entire surface of the semiconductor substrate 200. The second dielectric film 210 is selectively etched to create openings to the metal electrodes 209, thereby forming a second dielectric film pattern 210a. Then, the fifth photoresist pattern 211 is removed by etching and cleaning, thereby completing an MIM capacitor of semiconductor device.

The semiconductor device manufactured by the aforementioned process can prevent a step coverage issue between the MIM capacitor region and its circumferential region. The total thickness of the deposited insulator film 204 and second metal film (upper capacitor electrode) 205 corresponds to the depth of the recess included in the first metal film (lower capacitor electrode) 201.

Example FIGS. 3A to 3J are cross sectional views explaining a manufacturing method of a stack MIM capacitor in a semiconductor device according to embodiments. As shown in example FIG. 3A, a first metal film having a predetermined thickness may be formed over a semiconductor substrate 300. Then, a photoresist layer may be coated over the first metal film, and the coated photoresist layer is patterned, thereby forming a first photoresist pattern. The first metal film may be formed of aluminum (Al) or copper (Cu) at a predetermined thickness between approximately 4000 Å and 5000 Å.

By performing an etching process using the first photoresist pattern as a mask, the first metal film 301 is provided with a recess having a predetermined depth. In this case, the first metal film 301 indicates a lower electrode of a first capacitor (C1). Then, the first photoresist pattern is removed by etching and cleaning. In this case, the recess included in the first metal film (lower capacitor electrode) 301 is formed to depth of about 1250 Å to 1440 Å.

An insulator film 304 provided with a thickness of about 700 Å to about 840 Å. A second metal film (upper capacitor electrode) 305 provided at a thickness of about 450 Å to 600 Å are sequentially deposited over an entire surface of the first metal film (lower capacitor electrode) 301, whereby the recess is filled up.

Then, a planarization process using a CMP (chemical mechanical polishing) is carried out to expose the first metal film (lower capacitor electrode) 301. The total thickness of the insulator film 304 and second metal film (upper capacitor electrode) 205 deposited in sequence may correspond to the depth of the recess included in the first metal film 301. Also, the upper surface of the second metal film 305 may be the same height as the upper surface of the first metal film 301. The second metal film 305 may be formed of aluminum (Al) or copper (Cu).

As shown in example FIG. 3B, a photoresist layer is coated over the first metal film (lower capacitor electrode) 301 including the insulator film 304 and the second metal film (upper capacitor electrode) 305, and then the coated photoresist layer is patterned, thereby forming a second photoresist pattern 306. The first metal film 301 is selectively etched to the initial recess depth using the second photoresist pattern 306 as a mask. This etching process disconnects the lateral sides of the insulator film 304 and second metal film 305 from the inner lateral side of the recess in the first metal film 301.

Referring to example FIG. 3C, the second photoresist pattern 306 is removed by etching and cleaning. A first dielectric film is formed over an entire surface of the first metal film 301a including the insulator film 304 and the second metal film 305. To form contact holes in the first dielectric film, a photoresist layer is coated and patterned, thereby forming a third photoresist pattern. An etching process using the third photoresist pattern as a mask is performed to selectively etch the first dielectric film, thereby forming a first dielectric film pattern 307 including the contact holes.

The third photoresist pattern is removed by etching and cleaning. A conductive film is deposited over the first dielectric film pattern 307 including the contact holes, so that the contact holes are filled up with conductive material. A planarization process using a CMP exposes the first dielectric film pattern 307, forming plugs 308 which contact the first and second metal films.

As shown in example FIG. 3D, a third metal film having a predetermined thickness is deposited over the first dielectric film pattern 307. After that, a photoresist layer is coated over the third metal film, and the coated photoresist layer is patterned to form a fourth photoresist pattern. The third metal film is etched selectively using the fourth photoresist pattern as a mask, thereby providing a second recess having a predetermined depth. Then, the fourth photoresist pattern is removed by etching and cleaning.

Next, a second insulator film 310 having a predetermined thickness and a fourth metal film 311 are sequentially deposited over an entire surface of the third metal film 309, whereby the second recess is filled up. In this case, the fourth metal film 311 indicates an upper electrode of the second capacitor (C2). A planarization process using a CMP exposes the upper surface of the third metal film 309.

As shown in example FIG. 3E, a photoresist layer is coated over the third metal film 309 and patterned to form a fifth photoresist pattern. The third metal film 309 is selectively etched to the depth of second recess using the fifth photoresist pattern as a mask to disconnect the lateral sides of the second insulator film 310 and fourth metal film 311 from the inner lateral side of the second recess in the third metal film 309. The total thickness of the second insulator film 310 and fourth metal film 311 may correspond to the depth of the second recess. Then, the fifth photoresist pattern is removed by etching and cleaning.

A photoresist layer is coated over the third metal film 309 including the second insulator film 310 and the fourth metal film 311, and then the coated photoresist layer is patterned to form a sixth photoresist pattern. The third metal film 309 is selectively etched using the sixth photoresist pattern as a mask, whereby the third metal film 309 is divided. Through the selective etching process, a first step coverage metal film 309a is formed to be overlapped with the second metal film (upper electrode of first capacitor) 305 and to be in contact with the first plug 308.

A first metal line 309b is overlapped with a predetermined portion of the first metal film 301a, whereby the first metal line 309b is in contact with the first plug 308. The first step-coverage metal film 309a and the first metal line 309b are divided, so that the first step-coverage metal film 309a is positioned at a predetermined interval from the first metal film pattern 309b. The sixth photoresist pattern is removed by etching and cleaning. The upper surface of the fourth metal film 311 may be the same height as the upper surfaces of the first step-coverage metal film 309a and first metal line 309b.

As shown in example FIG. 3F, a second dielectric film is formed over the entire surface of the semiconductor substrate 300 including the first metal line 309b and the first step-coverage metal film 309a. After that, a photoresist layer is coated over the second dielectric film, and then the coated photoresist layer is patterned to form a seventh photoresist pattern. The second dielectric film is selectively etched using the seventh photoresist pattern as a mask, thereby forming a second dielectric film pattern 312 including a plurality of contact holes. Then, the seventh photoresist pattern is removed by etching and cleaning.

A second conductive film is deposited over the second dielectric film pattern 312 including the plurality of contact holes so as to fill up the plurality of contact holes. A planarization process using a CMP exposes the upper surface of the second dielectric film pattern 312, thereby forming a plurality of second plugs 313 which are in contact with the first metal line 309b, the fourth metal film 311 and the first step-coverage metal film 309a.

As shown in example FIG. 3G, a fifth metal film having a predetermined thickness is formed over the second dielectric film pattern 312. Then, a photoresist layer is coated over the fifth metal film, and the coated photoresist layer is patterned to form an eighth photoresist pattern. The fifth metal film is selectively etched using the eighth photoresist pattern as a mask, thereby forming a fifth metal film 314 with a third recess having a predetermined depth. Then, the eighth photoresist pattern is removed by etching and cleaning.

The third recess is filled up by depositing a third insulator film 315 and a sixth metal film 316 over an entire surface of the fifth metal film 314. The sixth metal film 316 constitutes an upper electrode of the third capacitor (C3). A planarization process using a CMP exposes the upper surface of the fifth metal film 314.

As shown in example FIG. 3H, a photoresist layer is coated over the fifth metal film 314 including the third insulator film 315 and the sixth metal film 316, and then the coated photoresist layer is patterned to form a ninth photoresist pattern. The fifth metal film 314 is selectively etched to the depth of third recess using the ninth photoresist pattern as a mask to disconnect the lateral sides of the third insulator film 315 and the sixth metal film 316 from the inner lateral side of the third recess included in the fifth metal film 314. The total thickness of the third insulator film 315 and sixth metal film 316 may correspond to the depth of third recess. The ninth photoresist pattern is removed by etching and cleaning.

Thereafter, a photoresist layer is coated over the fifth metal film 314 including the third insulator film 315 and the sixth metal film 316, and then the coated photoresist layer is patterned to form a tenth photoresist pattern. The fifth metal film 314 is selectively etched using the tenth photoresist pattern as a mask, thereby forming a second metal film pattern (second metal line) 314b which contacts the second plug 313.

Through the aforementioned selective etching process, a second step-coverage metal film (lower electrode of third capacitor) 314a is formed to be in contact with the second plugs 313, which are in contact with the first metal line 309b and the fourth metal film 311. Then, the tenth photoresist pattern is removed by etching and cleaning. The upper surface of the sixth metal film 316 may be the same height as the upper surfaces of the second metal film pattern 314b and second step-coverage metal film (lower electrode of third capacitor) 314a.

As shown in example FIG. 3I, a third dielectric film is formed over the entire surface of the semiconductor substrate 300 including the second metal film pattern 314b and the second step-coverage metal film 314a. Then, a photoresist layer is coated over the third dielectric film, and the coated photoresist layer is patterned to form an eleventh photoresist pattern. The third dielectric film is selectively etched using the eleventh photoresist pattern as a mask to form a third dielectric film pattern 317 including a plurality of contact holes. Then, the eleventh photoresist pattern is removed by etching and cleaning.

Next, a third conductive film is deposited over the third dielectric film pattern 317 including the plurality of contact holes so as to fill up the plurality of contact holes. A planarization process using a CMP is performed to expose the upper surface of the third dielectric film pattern 317, thereby forming third plugs 318 which are in contact with the second metal line 314b, the second step-coverage metal film 314a and the sixth metal film.

As shown in example FIG. 3J, a seventh metal film is formed over the third dielectric film pattern 317. Then, a photoresist layer is coated over the seventh metal film, and the coated photoresist layer is patterned to form a twelfth photoresist pattern. The seventh metal film is selectively etched using the twelfth photoresist pattern as a mask, and thereby divided into seventh metal film patterns 319 over the third dielectric film pattern 317. The first upper metal film pattern 319a (positioned at the left side of example FIG. 3J) contacts the third plug 318. The second upper metal pattern 319b (positioned at the right side of example FIG. 3J) contacts the third plug 319 which are in contact with the second metal film pattern (second metal line) 314b and the sixth metal film (upper electrode of third capacitor) 316. Then, the twelfth photoresist pattern is removed by etching and cleaning.

Thereafter, a fourth dielectric film is formed over the seventh metal patterns 319. Then, a thirteenth photoresist pattern is formed over the fourth dielectric film, and an etching process using the thirteenth photoresist pattern as a mask is performed to form a fourth dielectric film pattern 320 which provides openings over the seventh metal film. Thereafter, the twelfth photoresist pattern is removed by etching and cleaning.

Through the aforementioned manufacturing process, the semiconductor device according to embodiments includes the first MIM capacitor (C1) formed over the first metal film (lower electrode of first capacitor) 301a; the second MIM capacitor (C2) formed over the second step-coverage metal film (lower electrode of second capacitor) 309a; and the third MIM capacitor (C3) formed over the second step-coverage metal film (lower electrode of third capacitor) 314a.

Accordingly, the semiconductor device according to embodiments can prevent the step coverage issue between the MIM capacitor region and its circumferential region having no MIM capacitor therein, so that it is possible to form stack-structure MIM capacitors with the equivalent circuit of example FIG. 4. In example FIG. 4, the capacitor can obtain the capacity of "C=3 C1" if C1=C2=C3.

The capacitor according to embodiments can prevent the step coverage issue caused by the thickness of insulator film and upper metal film included the metal-insulator-metal (MIM) capacitor, between the MIM capacitor region and its circumferential region having no MIM capacitor therein. Also, the capacitor according to embodiments can prevent a DOF (Depth of Focus) issue by preventing the step coverage issue over the upper insulator film.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a first metal film provided with a recess having a predetermined depth over a semiconductor substrate;
an insulator film and a second metal film formed in the recess with a thickness corresponding to a depth of the recess, wherein the insulator film and metal film are disconnected from an inner lateral side of the recess;
a dielectric film including a plurality of plugs over the first metal film, the insulator film and the second metal film, wherein the plugs are in contact with the first metal film and the second metal film; and
a plurality of metal electrodes in contact with the plugs on the dielectric film.

2. The apparatus of claim 1, further comprising a nitride film, formed over the metal electrodes, selectively removed to open predetermined portions of the metal electrode.

3. The apparatus of claim 1, wherein the upper surface of the second metal film is in the same height as the upper surface of the first metal film.

4. An apparatus comprising: a first metal film provided with a recess having a predetermined depth over a semiconductor substrate; and a plurality of capacitors formed by sequentially depositing an insulator film and a second metal film over the recess, wherein the insulator film and second metal film are disconnected from the inner lateral side of the recess included in the first metal film.

5. The apparatus of claim 4, wherein the upper surface of the first metal film is the same height as the upper surface of the second metal film formed over the insulator film.

6. The apparatus of claim 4, wherein the total thickness of the insulator film and second metal film corresponds to the depth of the recess.

7. An apparatus comprising:
a first metal film provided with a recess having a predetermined depth over a semiconductor substrate;
a first insulator film and a second metal film formed in the recess with a thickness corresponding to a depth of the recess, wherein the first insulator film and second metal film are disconnected from an inner lateral side of the recess;
a first dielectric film pattern including a first plurality of plugs which are in contact with the first metal film and the second metal film;
a first metal line in contact with a first plug among the first plurality of plugs which is in contact with the first metal film;
a first step-coverage metal film, provided at a predetermined interval from the first metal line, in contact with a second plug among the first plurality of plugs in contact with the second metal film;
a second insulator film and a fourth metal film disconnected from the inner lateral side of the first step-coverage metal film over the lower portion of the first step-coverage metal film;
a second dielectric film pattern including a second plurality of plugs which are in contact with the first metal line, the fourth metal film and the first step-coverage metal film over the first metal line and the first step-coverage metal film;
a second metal line in contact with a first plug among the second plurality of plugs which is in contact with the first step-coverage metal film over the second dielectric film pattern;
a second step-coverage metal film in contact with a second plug among the second plurality of plugs which is in contact with the first metal line and the fourth metal film, overlapped with the first metal line and the fourth metal film at a predetermined interval from the second metal line over the second dielectric film pattern;
a third insulator film pattern and a sixth metal film, formed to be disconnected from the inner lateral side of the second step-coverage metal film over the second step-coverage metal film;
a third dielectric film including a third plurality of plugs in contact with the second metal line, the sixth metal film and the second step-coverage metal film over the second step-coverage metal film and the second metal line;
a first upper metal electrode being in contact with a first plug among the third plurality of plugs which is in contact with the second step-coverage metal film over the third dielectric film; and
a second upper metal electrode in contact with a second plug among the third plurality of plugs which is in contact with the second metal line and the sixth metal film over the third dielectric film.

8. The apparatus of claim 7, wherein the upper surface of the first metal film is at the same height as the upper surface of the second metal film.

9. The apparatus of claim 7, wherein the upper surface of the fourth metal film is at the same height as the upper surfaces of the first metal line and first step-coverage metal film.

10. The apparatus of claim 7, wherein the upper surface of the sixth metal film is at the same height as the upper surfaces of the second metal line and second step-coverage metal film.

11. The apparatus of claim 7, further comprising a silicon nitride film selectively removed to open a predetermined portion of the metal electrode over the third dielectric film.

12. The apparatus of claim 7, wherein the first metal film, the first step-coverage metal film and the second step-coverage metal film are formed of one of aluminum or copper.

13. The apparatus of claim 7, wherein the first insulator film pattern, the second insulator film pattern, and the third insulator film pattern are formed of one of silicon oxide or silicon nitride.

14. A method comprising:
forming a first metal film provided with a recess having a predetermined depth over a semiconductor substrate;
sequentially depositing an insulator film and a second metal film over the recess at a predetermined thickness corresponding to a depth of the recess, wherein the insulator film and metal film are disconnected from an inner lateral side of the recess; and
forming a dielectric film pattern including plugs in contact with the first metal film and the second metal film.

15. The method of claim 14, wherein the upper surface of the first metal film is at the same height as the upper surface of the second metal film.

* * * * *